United States Patent [19]

Komiya et al.

[11] Patent Number: 4,544,971
[45] Date of Patent: Oct. 1, 1985

[54] MEMORY CASSETTE HOLDING APPARATUS

[75] Inventors: Hidetsugu Komiya, Hino; Seiichi Hattori, Hachioji, both of Japan

[73] Assignee: Fanuc Ltd., Minamitsuru, Japan

[21] Appl. No.: 478,729

[22] Filed: Mar. 25, 1983

[30] Foreign Application Priority Data

Mar. 29, 1982 [JP] Japan ............................. 57-44267[U]

[51] Int. Cl.⁴ ............................................. G11B 15/00
[52] U.S. Cl. ...................................... 360/96.5; 360/71
[58] Field of Search ................... 360/71, 90, 93, 96.1, 360/96.5, 105

[56] References Cited

U.S. PATENT DOCUMENTS

| | | | |
|---|---|---|---|
| 3,797,033 | 3/1974 | Prieur | 360/105 X |
| 3,855,627 | 12/1974 | Vettore et al. | 360/96.1 X |
| 3,875,590 | 4/1975 | Mandish | 360/93 X |
| 3,877,075 | 4/1975 | Watanabe | 360/105 X |
| 3,973,272 | 8/1976 | Morgan et al. | 360/105 X |
| 4,396,963 | 8/1983 | Wright | 360/105 X |

FOREIGN PATENT DOCUMENTS 976753  3/1964  Fed. Rep. of Germany .
2643997  3/1978  Fed. Rep. of Germany .

*Primary Examiner*—John H. Wolff
*Attorney, Agent, or Firm*—Staas & Halsey

[57] ABSTRACT

An apparatus for holding a memory cassette in a cassette adapter wherein the memory cassette cannot be ejected from the adapter, even by pressing an eject button, while data is being written into or read from the memory cassette. Provided are means for generating a signal indicating that a read or write operation is in progress, a locking mechanism for locking a cassette ejecting mechanism to render the latter inoperable, and a drive circuit responsive to the generated signal for actuating the locking mechanism to prevent ejection of the memory cassette until the read or write operation is completed.

6 Claims, 4 Drawing Figures

MEMORY CASSETTE HOLDING APPARATUS

BACKGROUND OF THE INVENTION

This invention relates to a memory cassette holding apparatus and, more particularly, to a memory cassette holding apparatus which assures that an ejecting mechanism will not operate while data is being written into or read from a memory cassette.

To preserve numerical control (NC) data created for numerically controlling a machine, robot or the like, use is made of a memory cassette such as a magnetic tape cassette, bubble memory cassette or semiconductor memory cassette. This is accomplished by loading the memory cassette in a numerical control device or NC data creation device, writing the NC data stored in the internal memory of the numerical control device, or created by the NC data creation device, into the memory cassette, and then subsequently reading the NC data out of the memory cassette to execute numerical control based on the NC data.

When using a memory cassette, there is always the danger that the operator may inadvertently press an eject button and cause ejection of the memory cassette while the NC data is being written into or read from the memory cassette. An accident of this kind will prevent the NC data from being correctly written into or read from the cassette, or may mutilate machining NC data already stored in the memory cassette at a different location. Thus there is need of an apparatus capable of cancelling the operation that would otherwise be initiated by pressing the eject button while data is being written into or read from the memory cassette.

SUMMARY OF THE INVENTION

Accordingly, it is a primary object of the present invention to provide a memory cassette holding apparatus so adapted that the memory cassette will not be ejected during the writing or reading of data.

According to the present invention, the foregoing and other objects are attained by providing an apparatus for holding a memory cassette so that data may be written into and read from the memory cassette. The apparatus includes a holder for holding the memory cassette, an ejecting mechanism for ejecting the memory cassette from the holder, a locking mechanism for locking the ejecting mechanism to prevent ejection of the memory cassette from the holder, and a drive circuit for actuating the locking mechanism in response to a signal generated while data is being written into the memory cassette and read from the memory cassette. The locking mechanism renders the ejecting mechanism inoperable to prevent ejection of the memory cassette while data is being written into or read from the memory cassette. Such an arrangement assures that the data can be written and read correctly, and that already stored data will not be mutilated, even if an eject button is accidentally pressed when a read or write operation is in progress.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

Figure 1:
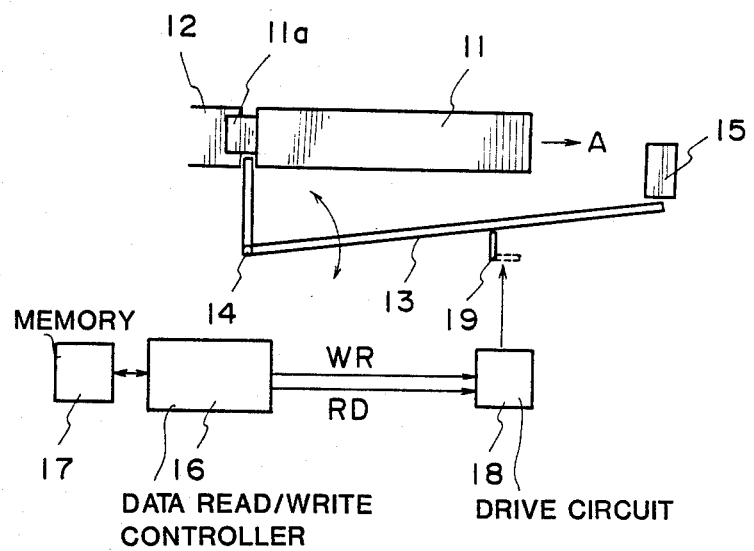
FIG. 1 is a schematic view useful in describing the principle of the present invention.

Referring first to FIG. 1 illustrating the principle of the invention, a cassette holder 12 is adapted to hold an end portion 11a of a memory cassette 11. A substantially L-shaped eject lever 13 constituting part of an ejecting mechanism and supported for rotation about a pivot shaft 14, has the ejector end thereof disposed in a gap formed between the memory cassette 11 and the cassette holder 12. An eject button 15 is so disposed as to abut against the other or right end of the eject lever 13 from the side thereof. The arrangement is such that when the eject lever 13 is rotated clockwise in FIG. 1 about the pivot shaft 14 by pressing the eject button 15, the memory cassette 11 is ejected in the direction of the arrow A. A data read/write controller 16 is provided for producing a signal WR when NC data stored in a memory 17 is being written into the memory cassette 11, and a signal RD when the NC data is being read out of the memory cassette. Hereinafter the signals WR, RD will be referred to as write mode and read mode signals, respectively. When either of these signals is generated, a drive circuit 18 responds by causing a locking mechanism 19 to lock the eject lever 13 against rotation even if the eject button 15 is pressed. The eject lever 13 will remain locked until the signal WR or WD vanishes. The locking mechanism 19 may comprise an ordinary electromagnet and an armature (neither of which are shown in FIG. 1), wherein the electromagnet is excited, responsive to generation of the write mode signal WR or read mode signal RD, to thrust the armature into the position indicated by the solid lines in FIG. 1, thereby preventing rotation of the eject lever 13. When either of these signals vanishes, the electromagnet is deenergized and the armature is retracted to the position indicated by the broken lines, allowing clockwise rotation of the eject lever 13 when pressed by the button 15.

Figure 2:
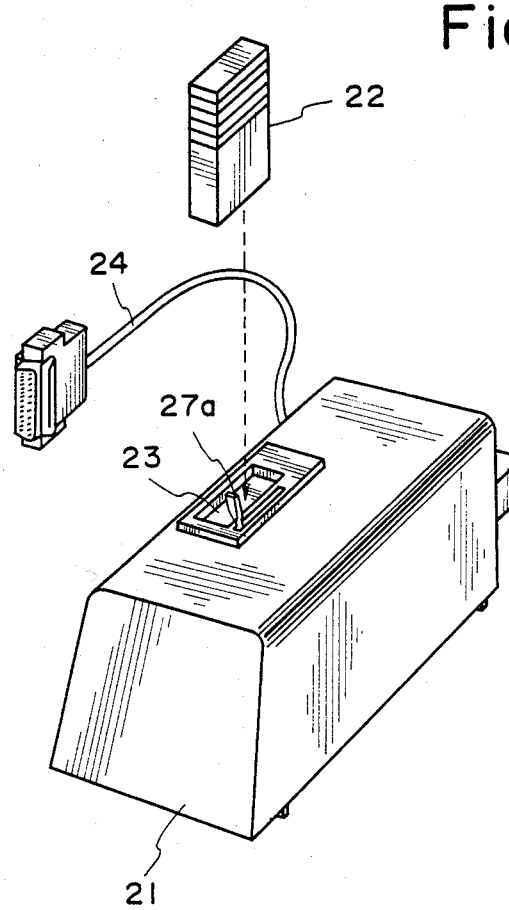
FIG. 2 is a perspective view of an adapter using a memory cassette holding apparatus according to an embodiment of the present invention.
Figure 3:
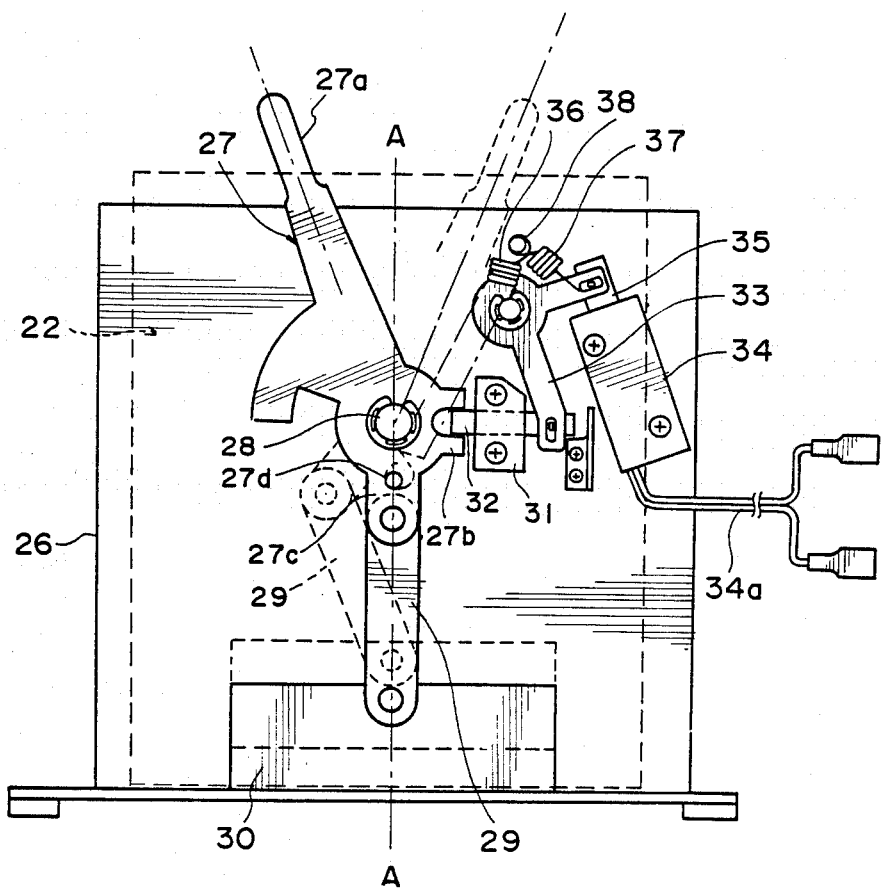
FIG. 3 is a front view illustrating the construction of a memory cassette holding apparatus embodying the present invention.

Reference will now be made to FIGS. 2 and 3 to describe a preferred embodiment of the invention in detail. FIG. 2 shows an adapter 21 which uses the memory cassette holding apparatus of the invention. The adapter 21 has a cassette inlet 23 in which a memory cassette, such as a bubble memory cassette 22, is inserted so that NC data or an NC program stored in the cassette may be read from the cassette and transferred to a numerical control device (not shown) via a connecting cable 24, or so that NC data or an NC program transferred from the numerical control device via the cable 24 may be written into the bubble memory cassette 22. Projecting from a slot in the adapter 21 is the distal end 27a of a lever 27 described below. A button or cap, not shown, is adapted to fit on the lever end 27a to facilitate the operation of the lever.

FIG. 3 is a front view illustrating the details of a memory cassette holding apparatus embodying the present invention. A holding plate 26 made of metal is provided for supporting the holding apparatus in its entirety. The lever 27 mentioned above in connection with FIG. 2 is pivotally supported on the holding plate 26 by means of a pin 28 affixed to the holding plate. Fit onto the distal end 27a of the lever 27 is an eject button, not shown. Part of the lever 27 adjacent pin 28 is formed into a bifurcated locking portion 27b. The lever 27 also has a short extension 27c having a pin 27d implanted near the root portion thereof. A link 29 is provided having one end attached for rotation to the distal end of the extension 27c of lever 27. The other end of the link 29 is attached for rotation to a rack 30 which, by operation of the lever 27 acting through the link 29, is adapted to pull up the bubble memory cassette 22 to enable its extraction. Although the details are not illustrated, the rack 30 is adapted for vertical movement along the line A—A in FIG. 3. The lever 27, link 29 and rack 30 comprise an ejecting mechanism.

Numeral 31 designates a guide member penetrated by a locking rod 32 movable horizontally through the guide member so that one end of the rod 32 is engagable with the bifurcated locking portion 27b of the lever 27. A locking rod drive lever 33 is pivotally mounted on the holding plate 26. The locking rod drive lever 33 has a substantially L-shaped configuration, the end of one leg thereof being coupled to the other end of the locking rod 32, the end of the other leg thereof being coupled to an armature 35. The latter is so adapted as to be freely movable through the interior of a magnet coil 34 affixed to the holding plate 26. Energizing the magnet coil 34 draws the armature 35 inwardly thereof to the position shown in FIG. 3. The magnet coil 34 is connected to the drive circuit 18 (FIG. 1) by a cable 34a. Numeral 38 designates a pin implanted in the holding plate 26. A tension spring 36 is stretched between the pin 38 and the pin 27d implanted in the extension 27c of the lever 27, and serves to hold the lever 27 in either a cassette load position, indicated by the solid lines in FIG. 3, or cassette eject position, which is indicated by the broken lines. A second tension spring 37 is stretched between the pin 38 and the end of the locking rod drive lever 33 coupled to the armature 35, and serves to constantly bias the drive lever 33 in the counter-clockwise direction. The locking rod 32, locking rod drive lever 33, magnet coil 34 and armature 35 comprise a locking mechanism. Note that the cassette holder, shown at 12 in FIG. 1, is deleted from FIG. 3 for the sake of simplicity, In the operation of the memory cassette holding apparatus of FIG. 3, the bubble memory cassette 22, indicated by the dashed line, is shown already loaded in the cassette inlet 23 of the adapter 21 (FIG. 2), and the associated mechanisms are shown in the attitudes assumed during the writing or reading of information with respect to the bubble memory cassette. Specifically, the magnet coil 34 is in the energized state so that the armature 35 is retracted into the coil. The locking rod drive lever 33 therefore is rotated in the clockwise direction against the pulling force of the tension spring 37, thereby pushing the locking rod 32 to the left in FIG. 3 to engage the end of the rod 32 with the bifurcated locking portion 27b of the lever 27. This locks the lever 27 against rotation, so that the bubble memory cassette 22 cannot be ejected. When the write or read operation is completed, the magnet coil 34 is deenergized to release the armature 35 from the attractive force applied by the coil, so that the locking rod drive lever 33 is rotated in the counter-clockwise direction under the pulling force applied by the tension spring 37, thereby pulling the locking rod 32 to the right in FIG. 3 to disengage the end thereof from the locking portion 27b of the lever 27. The lever 27 now is capable of rotation about the pin 28. The operator may now rotate the lever 27 from the cassette load position to the eject position, whereby the link 29 interconnecting the lever 27 and the rack 30 is displaced from the position indicated by the solid lines to that indicated by the broken lines. The rack 30 will therefore be pulled upward in FIG. 3 along the line A—A, bringing the bubble memory cassette 22 to a position where it can be extracted from the adapter 21, shown in FIG. 2.

Note that no problems are encountered even if the bubble memory cassette 22 should be inserted into the cassette inlet with the lever 27 in the eject position and the rack 30 in the raised attitude as a result. The reason is that a read or write operation will not be in effect at such time so that the locking rod 32 will be at its rightmost position where it is disengaged from the locking portion 27b, allowing the lever 27 to be rotated freely about the pin 28. When the bubble memory cassette 22 is inserted, therefore, the bottom of the cassette depresses the rack 30 which, owing to its connection to the lever 27 via link 29, rotates the lever 27 forcibly in the counter-clockwise direction to restore the lever to the cassette load position.

Figure 4:
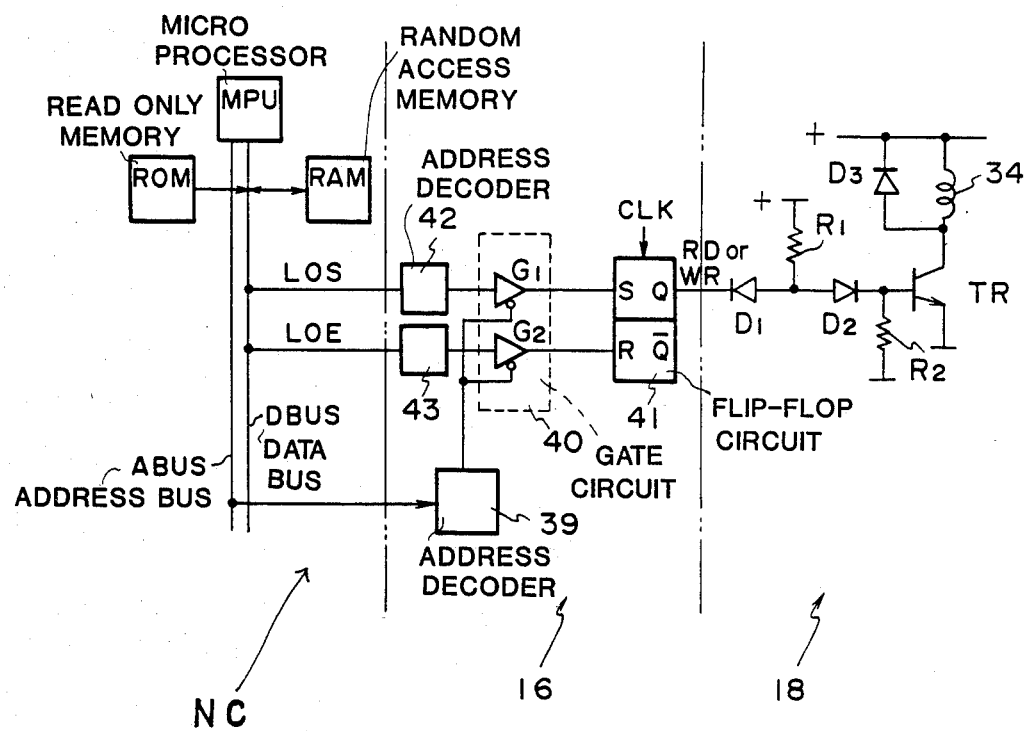
FIG. 4 is a circuit diagram of circuitry associated with the embodiment of the memory cassette holding apparatus illustrated in FIG. 3.

FIG. 4 is a circuit diagram illustrating the data read/write controller 16 and drive circuit 18. The read/write controller 16 comprises address decoders 39, 42, 43 which receive input signals from a numerical control device NC, described below, a gate circuit 40 receiving the outputs of the address decoders 39, 42, 43, the gate circuit 40 having gates G1, G2, and a flip-flop circuit 41 whose set and reset terminals are connected to the outputs of the respective gates G1, G2 of the gate circuit 40. The drive circuit 18 comprises diodes D1, D2, D3, resistors R1, R2, a transistor TR and the magnetic coil 34 of FIG. 3. MPU, ROM, RAM represent a microprocessor, read-only memory and random access memory, respectively, these comprising the numerical control device NC mentioned above. ABUS is an address bus, and DBUS a data bus. The numerical control device NC is adapted to apply a signal to the address decoder 39 at the beginning and end of a read or write operation. The numerical control device also applies a lock start signal LOS to the address decoder 42 at the onset of a read or write operation, and a lock end signal LOE to the address decoder 43 at the end of the read or write operation.

When information is neither being written into nor read from the bubble memory cassette 22, the flip-flop circuit 41 is in the reset state so that its Q output is low and $\overline{Q}$ output high. Since the base of the transistor TR will be at a low potential as a result, the transistor will be non-conductive and no current will flow into the magnet coil 34. Now assume that the operator initiates a read or write operation with respect to the loaded bubble memory cassette 22. The numerical control device NC responds by simultaneously selecting the address decoder 39 by an address signal delivered from the address bus ABUS, whereby the address decoder 39 produces an output signal which opens both gates G1, G2 of the gate circuit 40. Then, when the lock start signal LOS is applied to the input of the decoder 42 from the data bus DBUS of the numerical control device NC, the decoder 42 produces an output signal which is passed by the open gate G1 to place the flip-flop 41 in the set state. This sends the Q output of the flip-flop 41 to the high level so that transistor TR is driven into conduction, thereby energizing the magnet coil 34. This prevents the bubble memory cassette 22 from being ejected from the adapter 21, as described above in conjunction with FIG. 3. With the bubble memory cassette 22 in the locked state, either a numerical control program stored therein is read from the cassette and transferred to the random access memory RAM, or a numerical control program stored in the RAM is transferred from the RAM to the cassette 22 for storage.

When the above-described read or write operation is completed, the address decoder 39 is again selected by a signal from the address bus ABUS of the numerical control device and again responds by opening the gates G1, G2 of the gate circuit 40. The numerical control device now delivers a lock end signal LOE from the data bus DBUS to the input of the decoder 43, the latter responding by producing an output signal which the open gate G2 aplies to the flip-flop circuit 41 to place the flip-flop in the reset state. This sends the Q output of the flip-flop to the low level, cutting of the transistor TR and de-energizing the magnet coil 34. The bubble memory cassette 22 is thereby released from the locked state so that the cassette can be ejected at will.

As many apparently widely different embodiments of the present invention can be made without departing from the spirit and scope thereof, it is to be understood that the invention is not limited to the specific embodiments thereof except as defined in the appended claims.

We claim:

1. An apparatus having a holder for holding a memory cassette so that data may be written into or read from the memory cassette, comprising:
   (a) ejecting means for ejecting the memory cassette, the ejecting means having a rotatable lever and a rack coupled to the lever for being displaced thereby when said lever is rotated, said rack being adapted to eject the memory cassette from the holder when displaced in a prescribed direction by rotation of said lever, and
   (b) locking means for selectively locking the ejecting means, the locking means having a magnet coil, an armature displaced by excitation of the magnet coil and a locking rod mechanically coupled to the armature for being moved thereby, said magnet coil being excited while data is being written into the memory cassette or read from the memory cassette, whereby said locking rod is moved by said armature to lock said lever against rotation, thereby preventing said ejecting means from ejecting the memory cassette before the writing of data into the memory cassette or the reading of data from the memory cassette has been completed.

2. The apparatus according to claim 1, wherein said lever has means for engaging said locking rod, said locking rod being moved into engagement with said engaging means by said armature to lock said lever against rotation.

3. The apparatus according to claim 1, wherein the ejecting means comprises:
   (i) a rotatable lever, and
   (ii) a rack coupled to the lever for being displaced thereby when said lever is rotated, said rack being adapted to eject the memory cassette from the holder when displaced in a prescribed direction by rotation of said lever.

4. The apparatus according to claim 3, wherein the locking means comprises:
   (i) a magnet coil,
   (ii) an armature displaced by excitation of the magnet coil, and
   (iii) a locking rod mechanically coupled to the armature for being moved thereby,
said magnet coil being excited while data is being written into the memory cassette or read from the memory cassette, whereby said locking rod is moved by said armature to lock said lever against rotation, thereby preventing said ejecting means from ejecting the memory cassette before the writing of data into the memory cassette or the reading of data from the memory cassette has been completed.

5. The apparatus according to claim 4, wherein the circuit means comprises:
   (i) a numerical control device;
   (ii) a data read/write controller electrically connected to the numerical control device; and
   (iii) a drive circuit having a plurality of diodes, a plurality of resistors and a transistor, each electrically connected to the data read/write controller, wherein the numerical control device is adapted to apply a lock start signal to the data read/write controller at the onset of a read or write operation and a lock end signal to the data read/write controller at the end of the read or write operation, whereby the data read/write controller sends an output to the drive circuit to energize the magnet coil and lock the lever and to de-energize the magnet coil and unlock the lever, respectively.

6. An apparatus for holding a memory cassette so that data may be written into or read from the memory cassette, comprising:
   (a) a holder for holding the memory cassette;
   (b) ejecting means for ejecting the memory cassette from said holder;
   (c) locking means for locking said ejecting means to prevent ejection of the memory cassette from said holder; and
   (d) circuit means for actuating said locking means in response to a signal generated while data is being written into the memory cassette or read from the memory cassette, whereby said locking means prevents said ejecting means from ejecting the memory cassette from said holder before the writing of data into the memory cassette or the reading of data from the memory cassette has been completed.

* * * * *